(12) United States Patent
Wolfgram (10) Patent No.: US 7,582,988 B2
(45) Date of Patent: Sep. 1, 2009

(54) LETHAL ELECTRIC FENCE ENERGIZER

(75) Inventor: Kirk Wolfgram, Rochester, MN (US)

(73) Assignee: Zareba Security, Inc., Plymouth, MN (US)

( * ) Notice: Subject to any disclaimer, the term of this patent is extended or adjusted under 35 U.S.C. 154(b) by 153 days.

(21) Appl. No.: 11/537,636

(22) Filed: Sep. 30, 2006

(65) Prior Publication Data

US 2008/0079316 A1    Apr. 3, 2008

(51) Int. Cl.
H03K 3/64 (2006.01)
A01K 3/00 (2006.01)
H05C 1/06 (2006.01)

(52) U.S. Cl. .................. 307/108; 307/106; 256/10; 340/564; 361/232

(58) Field of Classification Search ............ 307/108, 307/106; 256/10; 340/564; 361/232
See application file for complete search history.

(56) References Cited

U.S. PATENT DOCUMENTS

| | | | |
|---|---|---|---|
| 1,500,188 A | 7/1924 | Goswick | |
| 2,400,829 A | 5/1946 | Kennedy | |
| 3,051,449 A | 8/1962 | Legrand | |
| 3,422,280 A * | 1/1969 | Olson | 307/132 R |
| 3,655,994 A | 4/1972 | Malme | |
| 3,868,545 A | 2/1975 | Caron | |
| 3,873,847 A | 3/1975 | Finch et al. | |
| 3,988,594 A | 10/1976 | Low et al. | |
| 4,114,185 A | 9/1978 | Gallagher | |
| 4,200,809 A | 4/1980 | Madsen | |
| 4,394,583 A | 7/1983 | Standing | |
| 4,396,879 A * | 8/1983 | Weinreich et al. | 361/232 |
| 4,725,825 A | 2/1988 | McKean | |
| 4,859,868 A | 8/1989 | McKissack | |
| 4,939,618 A | 7/1990 | Fingerson et al. | |
| 5,381,298 A | 1/1995 | Shaw et al. | |
| 5,514,919 A | 5/1996 | Walley | |
| 5,742,104 A | 4/1998 | Eriksson et al. | |
| 5,767,592 A | 6/1998 | Boys et al. | |
| 5,790,023 A | 8/1998 | Wolfgram et al. | |
| 5,877,949 A | 3/1999 | Wolfgram et al. | |
| 5,898,125 A | 4/1999 | Mangolds et al. | |
| 5,949,636 A | 9/1999 | Johnson et al. | |
| 6,020,658 A * | 2/2000 | Woodhead et al. | 307/106 |
| 6,036,175 A | 3/2000 | Harper | |
| 6,479,909 B1 * | 11/2002 | Hamm et al. | 307/108 |
| 6,530,173 B2 | 3/2003 | Meade et al. | |
| 2004/0169171 A1 * | 9/2004 | Reeves et al. | 256/10 |
| 2006/0126260 A1 * | 6/2006 | Fehse | 361/232 |

OTHER PUBLICATIONS

PCT International Search Report dated Apr. 9, 2008 for PCT/US2007/078829, 2 pgs.
PCT Written Opinion dated Apr. 9, 2008 for PCT/US2007/078829, 8 pgs.

* cited by examiner

*Primary Examiner*—Albert W Paladini
*Assistant Examiner*—Hal I Kaplan
(74) *Attorney, Agent, or Firm*—Fredrikson & Byron, P.A.

(57) ABSTRACT

Electric fence energizers used with fencing systems are provided. The energizers can be used to provide an unsafe electric shock, as defined by safety agencies such as UL, where the electric fence energizers are capable of operating continuously regardless of the fence load. Alternately, the energizers can be equipped so as to be selectively set in one of a plurality of modes of operation, for example, "unsafe mode", "lethal mode", and "safe mode".

41 Claims, 10 Drawing Sheets

LETHAL ELECTRIC FENCE ENERGIZER

TECHNICAL FIELD

Embodiments of the present invention pertain to lethal electric fencing systems.

BACKGROUND

For years, electric fences have been used in agriculture settings for the purpose of containing livestock and/or repelling predators. Generally, the electric fences involve non-insulated fence wire being suspended in the air through the use of insulated members (e.g., made of plastic, porcelain, etc.) and being energized by an electric fence controller. The electric fence controller is generally provided with two output terminals. In one typical configuration, one of the terminals is connected to the electric fence wire while the other terminal is connected to ground. In turn, any animal that comes in contact with the fence wire while simultaneously being in contact with the ground receives an electric shock. Alternatively, the electric fence controller's output terminals may be connected to two fence wires positioned one above the other. In turn, any animal coming in contact with both fence wires simultaneously receives an electric shock.

In agricultural settings, the single fence wire/ground configuration and the two fence wire configuration described above involve electric fence controllers which deliver safe electric shocks. The safety parameters for such electric fence controllers are defined by safety agencies such as Underwriters Laboratories Inc. (UL). The UL document defining these safety parameters is UL69. In addition to a variety of safety requirements including acceptable construction methods, acceptable materials, and a number of other design related requirements, UL69 dictates the electrical parameters for the electric fence controller to achieve a safe output from the controller. The parameters define the maximum allowable current pulse which can be delivered to a resistive load of at least 500 Ohms. This maximum allowable current pulse or pulse segment is defined as $I=20 \times T^{-0.7}$, where I equals the maximum current pulse amplitude in milliamps rms, and T equals the pulse-width of the current waveform in milliseconds. The UL69 safety standard also defines a required period between pulses or pulse segments. When measured at the 7 mA level, this period or "off interval" must be at least 1 second. The UL69 safety standard further defines a maximum duration for the pulse current or pulse segment, which, when measured at the 300 mA level, is 1.5 milliseconds. In summary, in addition to all the other requirements defined in the UL69 safety standard, to be considered safe, when connected to a resistive load of at least 500 ohms, an electric fence controller must have (i) an output current pulse or pulse segment (a part of a current pulse that is between any two points in time within the duration of the current pulse as per UL69) in milliamps rms less than I, where $I=20 \times T^{-0.7}$, where T equals pulse width in milliseconds, (ii) an off-period measured at the 7 milliamp level of at least 1 second, and (iii) an on-period measured at the 300 milliamp level of not more than 1.5 milliseconds.

In recent years, electric fences have been used for law enforcement purposes. For example, electric fences have been implemented as part of perimeter fence systems. In such settings, electric fences have been used to provide a lethal electric output when contacted. Typically, the electric fence is physically located between two permanent non-electrified fences (e.g., of the chain-link type). The zone defined between the two permanent non-electrified fences typically extends across the perimeter of a prison and, quite often, is designated as a "shoot-to-kill" zone. As such, no one is allowed in the zone unless the fence is being serviced, and guards are instructed to shoot at anyone entering the zone in an effort to escape the prison. In essence, the lethal electric fence positioned between the two non-electrified fences functions as a further mechanism to dissuade prisoners from escaping via the fenced-in perimeter.

The lethal electric fence, like the non-lethal electric fence used in agricultural applications, uses a non-insulated fence wire typically supported in the air by insulated members. However, in the lethal application, the fence is constructed with a plurality of wires (e.g., typically at least twenty wires). Additionally, the fence wires are energized by a lethal electric fence energizer so that, as described above, when two wires are touched, a lethal shock is delivered. Existing lethal fence energizers generally are powered by an AC source, deliver an AC sinusoidal waveform to the fence wire, and include a linear step-up transformer. In some known systems, the lethal energizer may be used in pairs, where each energizer delivers a substantial AC voltage (e.g., several thousand volts AC), and where the energizers are of opposite polarity such that the voltage delivered to the fence wires can be effectively doubled. For example, with an output voltage of 6600 VAC at 500 mA, the load required to consume this amount of power would generally be equal to a 13,200 Ohm 3300 Watt resistor.

As described above, UL69 references a 500 Ohm resistor. This 500 Ohm resistor is generally used to represent a child that may touch the fence with the current path being from hand to foot. Likewise, an adult can be represented by a 1000 Ohm resistor. Placing a 1000 Ohm or 500 Ohm resistor across the output of a linear step-up transformer in known lethal electric fencing systems, e.g., involving lethal energizers having linear step-up transformers designed to deliver 500 mA into a 13200 Ohm resistor as exemplified above, will result in the transformer being loaded down such that the current will be higher than 500 mA, the voltage will be less than the 6600 VAC delivered into the 13200 Ohm load, and the supply current will increase compared to the condition where no load or a 13200 Ohm resistor is connected to the lethal energizer. While the current delivered to the 1000 Ohm load (or human) would be lethal, the lethal energizer is not designed for continuous operation into such a low resistance load (e.g., when an animal or human remains in contact with the lethal fence wire). The result of this situation, given enough time, is catastrophic for the lethal energizer. In turn, the fencing system would no longer provide a lethal barrier. Further, it has been found that the rate at which the lethal energizer catastrophically fails increases with the number of 1000 Ohm loads (or humans) that make contact with the fence at the same time.

To protect the lethal fence energizer and keep it from failing during false alarms, existing lethal fence systems are typically provided with a rodent wire consisting of a standard agricultural type electric fence wire placed a short height above the ground on each side of the lethal fence to keep rodents from contacting the lethal fence wires. While the rodent wire can be found to work reasonably well in protecting the lethal energizer from failing due to rodents touching the lethal fence wire, the rodent wire fails to prevent other larger bodies or conductive debris (e.g., that may be blown over one of the permanent non-electrified fences) from contacting, and ultimately, causing the lethal energizer to catastrophically fail, as described above.

Therefore, it would be advantageous to provide a lethal electric fence energizer that is not susceptible to the above limitations.

SUMMARY

In accordance with the present invention, there are several embodiments disclosed of lethal electric fence energizers used with lethal fencing systems. These embodiments include various apparatus and methods used to provide an unsafe electric shock, as defined by safety agencies such as UL, where the lethal electric fence energizers are capable of operating continuously regardless of the fence load. With respect to these embodiments, the energizers can be equipped so as to be selectively set in one of an "unsafe mode" and/or "lethal mode" (providing unsafe electric shocks, as mentioned above) or a "safe mode" (providing safe electric shocks, as described above and used in agricultural settings).

In one embodiment, an electric fence energizer is provided for use with an alternating current power source for continuously applying electrical energy pulses including at least lethal pulses to a fence without failing due to resistive loads contacting the fence. The energizer comprises a step-up transformer having a primary winding and a secondary winding, where the secondary winding is adapted for connection to the fence; a storage capacitor sharing a connection with both the primary winding of the transformer and an input being adapted for connection to the power source; a switch connected to the primary winding of the transformer, where the switch is operative to supply voltage stored in the storage capacitor across the primary winding when the switch is closed; and a timing circuit adapted to periodically trigger the switch so as to provide alternating on-periods and off-periods for the lethal pulses being delivered from the step-up transformer to the fence.

In another embodiment, an electric fence energizer is provided for use with an alternating current power source for continuously applying electrical energy pulses including at least lethal pulses to a fence without failing due to one or more low resistance loads contacting the fence. The energizer comprises a step-up transformer having a primary winding and a secondary winding, where the secondary winding is adapted for connection to the fence; a switch connected between the primary winding of the transformer and an input being adapted for connection to the power source, where the switch is operative to supply voltage from the power source across the primary winding when the switch is closed; and a timing circuit adapted to periodically trigger the switch so as to provide alternating on-periods and off-periods for the lethal pulses being delivered from the step-up transformer to the fence.

In an additional embodiment, an electric fence energizer is provided for use with an alternating current power source for continuously applying electrical energy pulses including at least lethal pulses to a fence without failing due to resistive loads contacting the fence. The energizer comprises a step-up transformer having a primary winding and a secondary winding, where the secondary winding is adapted for connection to the fence; and a current limiting means to prevent the step-up transformer from overheating when the lethal pulses are delivered to the fence.

In a further embodiment, an electric fence energizer is provided for use with an alternating current power source which is switchable between operating modes and, when used for applying lethal electrical energy pulses to a fence, is adapted to continuously operate without failing due to resistive loads contacting the fence. The energizer comprises a step-up transformer having a primary winding and a secondary winding, where the secondary winding is adapted for connection to the fence; a switch connected to the primary winding of the transformer, the switch is operative to supply voltage across the primary winding when the switch is closed; a timing circuit adapted to periodically trigger the switch so as to provide alternating on-periods and off-periods for the lethal pulses being delivered from step-up transformer to the fence; and one or more secondary switches, where one of the secondary switches is positioned between one or more of the power source and the primary winding and a controller within the timing circuit and the primary winding so as to vary one or more of the off-periods, the on-periods, and current of the pulses in order for the fence energizer to operate in one of a plurality of modes.

BRIEF DESCRIPTION OF THE DRAWINGS

The following drawings are illustrative of particular embodiments of the present invention and therefore do not limit the scope of the invention. The drawings are not to scale (unless so stated) and are intended for use in conjunction with the explanations in the following detailed description. Embodiments of the present invention will hereinafter be described in conjunction with the appended drawings, wherein like numerals denote like elements.

DETAILED DESCRIPTION

The following detailed description is exemplary in nature and is not intended to limit the scope, applicability, or configuration of the invention in any way. Rather, the following description provides practical illustrations for implementing exemplary embodiments of the present invention. In the foregoing detailed description, the invention has been described with reference to specific embodiments. However, it may be appreciated that various modifications and changes can be made without departing from the scope of the invention as set forth in the appended claims.

As described above, existing lethal electric fences typically have a plurality of wires, which are energized by a lethal electric fence energizer such that when two wires are touched, a lethal shock is delivered. As further described above, in some known systems, the lethal energizer can be used in pairs where each delivers high AC voltages (e.g., delivering 3300 VAC) and where the energizers can be configured to be of opposite polarity such that the voltage delivered to the fence wires can be effectively doubled (e.g., 6600 VAC at 500 mA). Using the above exemplary voltage and current output values, for lethal energizers having an output voltage of 6600 VAC at 500 mA, the load required to consume this amount of power is often equal to a 13,200 Ohm 3300 Watt resistor. Unfortunately, as described above, if one or more bodies (or other loads associated with debris) each having a resistance significantly less than 13,200 Ohms come in contact with the energized fence wire, the supply current drawn from the corresponding lethal energizers across the one or more bodies is found to increase quickly and significantly, leading to ultimate catastrophic failure of the lethal energizers and a halt to the fencing system continuing to function as a lethal barrier.

There are a variety of reasons for this catastrophic failure of the lethal energizers in existing lethal fencing systems; however, all stem from the lethal energizers not being able to function continuously when a low resistance load comes in contact with the energized fence where the load consumes more power than the energizer is capable of delivering. As a result, these existing lethal fencing systems generally fail after such an event. In addition, such an event may involve a condition, which leads to failure of the lethal energizers of the system before they can even be legitimately used.

Embodiments of the invention relate to providing a lethal electric fence energizer system capable of operating into any load that may be present on the fence wire without risk of failure due to the load connected to the energizer. In turn, the lethal energizers would be configured to provide an unsafe electric shock (e.g., as can be provided using the parameters defined in safety standard UL 69), where the energizers are capable of operating continuously regardless of the fence load. As described further below, as one skilled in the art would appreciate, with significant deviation from the safety standard UL 69, an unsafe shock could be further provided as a lethal shock.

Further embodiments of the invention relate to providing an electric fence energizer system that can selectively operated in one of a plurality of modes. In certain embodiments, one of the modes would involve unsafe output, and more preferably, lethal output, being delivered from the fence energizers. As described above, in such mode, the system would be capable of operating continuously without risk of failure regardless of the load on the fence wire. In certain embodiments, one of the modes would involve safe output being delivered from the fence energizers.

Figure 1A:
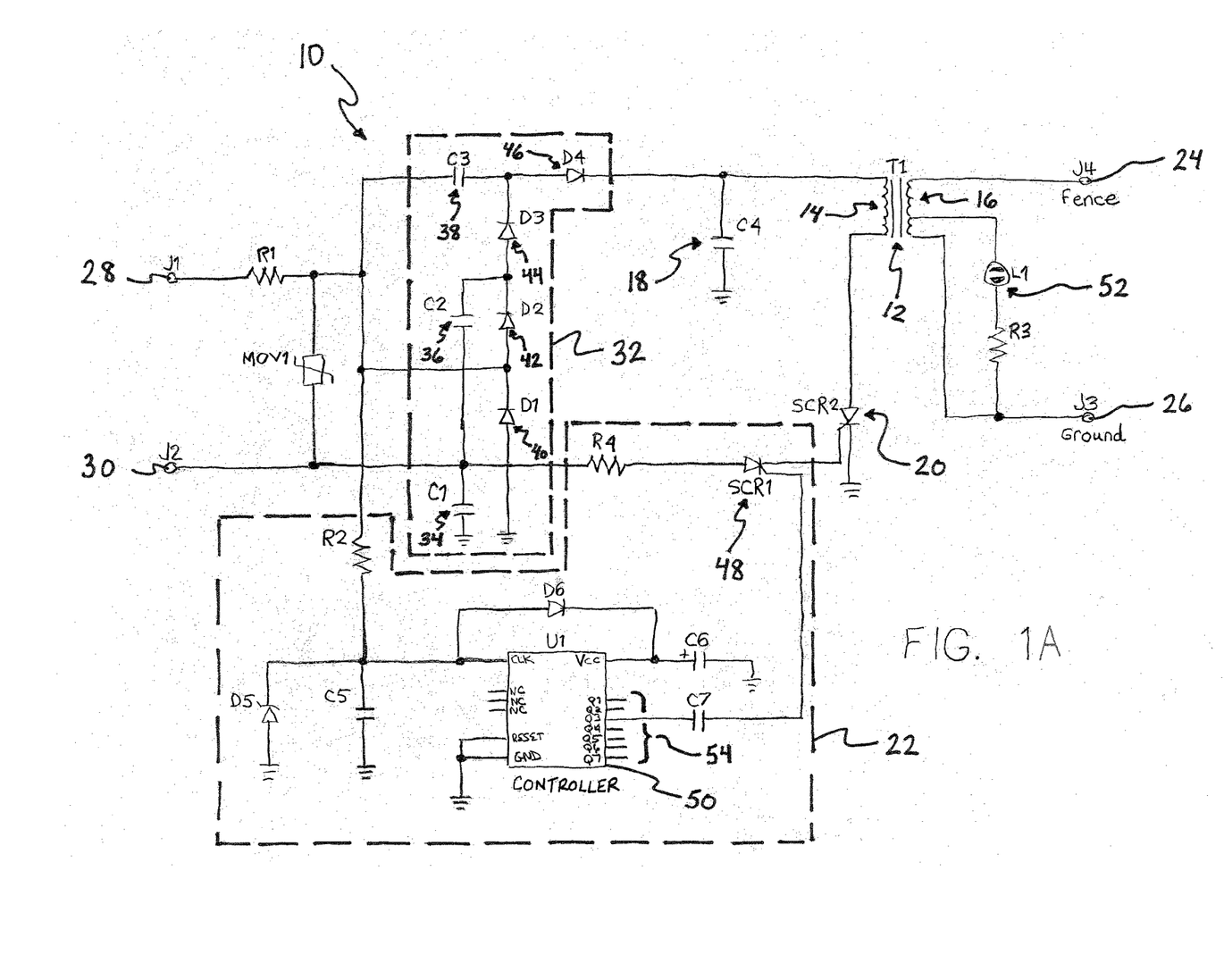
FIG. 1A is a partial circuit schematic for a lethal electric fence energizer in accordance with certain embodiments of the invention.

In certain embodiments, the lethal electric fence energizer can be provided with capacitive discharge circuitry. As described below, such circuitry involves voltage (stemming from a power source) being stored in a capacitor within the lethal energizer and being discharged into a step-up transformer when the capacitor is connected across the transformer. In turn, the output of the step-up transformer is connected to output terminals for connection to the lethal fence wire. As further described below, the capacitor of the lethal energizer is periodically charged and discharged at a predetermined rate regardless of the fence wire and load present on the fence wire. As such, the input power remains constant regardless of the fence wire and load present on the fence wire, allowing for continuous operation of the lethal energizer. FIG. 1A illustrates a partial circuit schematic of a lethal electric fence energizer configured for such functioning in accordance with certain embodiments of the invention.

As shown, the circuit 10 of FIG. 1A includes a step-up transformer (T1) 12 having a primary winding 14 and a secondary winding 16; a capacitor (C4) 18 sharing an electrical connection with a power source (not shown) and one end of the primary winding 14, where the capacitor (C4) 18 is used, over set time intervals, to be initially charged via voltage stemming from the power source and to be subsequently discharged across the primary winding 14; a switch (SCR2) 20 connected to the other end of the primary winding 14, where the switch (SCR2) 20, when opened, facilitates the charging of the capacitor (C4) 18, and when closed, facilitates the discharging of the capacitor (C4) 18 across the primary winding 14; a timing circuit 22 for controlling the rate that the switch (SCR2) 20 opens and closes; and a fence terminal (J4) 24 and a ground terminal (J3) 26 each respectively connected to ends of the secondary winding 16 for the purpose of connecting the circuit 10 to a fence wire (not shown).

In use, a voltage stemming from the power source is provided across inputs (J1) 28 and (J2) 30 of the circuit 10. The input voltage can generally range from 105 volts to 125 volts AC, 50-60 Hz. The input voltage is fed into a voltage multiplier 32, generally used to raise the amplitude of the input voltage to a desired value. For example, using the voltage multiplier 32, the input voltage may be increased to about 600 volts AC; however, it should be appreciated that the input voltage can be increased as desired. In certain embodiments, as shown, the voltage multiplier 32 is provided as a bank of capacitors 34, 36, and 38 (respectively referenced as C1, C2, and C3) and diodes 40, 42, 44, and 46 (respectively referenced as D1, D2, D3, and D4), the collective functioning of which should be appreciated by one skilled in the art. However, the invention should not be limited to such, as many other circuits can be alternatively used to provide the desired increase to the voltage input to the circuit 10.

As shown and described above, the switch (SCR2) 20 is operatively connected to one end of the primary winding 14 of the step-up transformer (T1) 12, while the capacitor (C4) 18, used to store the voltage output from the voltage multiplier 32, is connected to the other end of the primary winding 14. The opening and closing of the switch (SCR2) 20 functions in respectively charging the capacitor (C4) 18 with the voltage output from the voltage multiplier 32 and discharging the capacitor (C4) 18 across the primary winding 14 of the transformer (T1) 12. The opening and closing of the switch (SCR2) 20 is provided by the timing circuit 22, and in certain embodiments, is provided via a further switch (SCR1) 48 connected to an output of the timing circuit 22.

In certain embodiments, the timing circuit 22 includes a controller (U1) 50. As should be appreciated, the input voltage to the circuit 10 can be converted to DC so as to power the controller (U1) 50. In use, the controller (U1) 50 serves as a counter, and is used to establish a triggering rate for the opening and closing of the switch (SCR2) 20. As should be appreciated, the controller (U1) 50 is configured to deliver one or more pulses per second, with every pulse facilitating a closing of the switch (SCR2) 20 and a subsequent discharging of the capacitor (C4) 18 across the primary winding 14 of the transformer (T1) 12. In certain embodiments, as shown, the switch (SCR1) 48 is connected to the output of the timing circuit 22. In turn, every pulse delivered from the controller (U1) 50 facilitates a closing of the switch (SCR1) 48, which in turn, facilitates a closing of the switch (SCR2) 20.

As described above, every time the switch (SCR2) 20 is closed, the capacitor (C4) 18 discharges its stored voltage across the primary winding 14 of the step-up transformer (T1) 12. In turn, this voltage is transformed across the secondary winding 16 of the transformer (T1) 12 to a voltage of several thousand volts. The transformed voltage is subsequently delivered to the fence, i.e., across the fence terminal (J4) 24 and the ground terminal (J3) 26. In certain embodiments, as shown, a light (L1) 52 (e.g., a neon light) is connected to the secondary winding 16. In turn, every time voltage is discharged across the primary winding 14 (from the capacitor (C4) 18) and transformed across the secondary winding 16, the light (L1) 52 will be triggered to show the circuit's operation.

As should be appreciated, because the lethal energizer circuit 10 of FIG. 1A provides a continual charging and discharging alternation (via the capacitor (C4) 18, switch (SCR2) 20, and timing circuit 22), the step-up transformer (T1) 12 applies lethal power to the fencing system, but only periodically. In turn, the lethal energizer only applies power to the fence for short periods of time. As such, even if a small resistive load tends to overdrive the lethal energizer, the effect on the energizer is limited because it is only delivering power to the fence over these short periods of time. This intermittent application of power from the lethal energizer to the fence has been found to generally insulate the energizer from damage regardless of the load applied to the fence. As a result, the energizer has been found to not fail catastrophically like existing lethal fence energizers.

As should be appreciated, by inversely using the safety parameters defined in the UL69 safety standard, a fence energizer can be considered unsafe if, when connected to a resistive load of not less than, or at least, 500 ohms, the energizer has (i) an output current pulse or pulse segment more than I, where $I=20 \times T^{-0.7}$, where T equals pulse width in milliseconds, or (ii) an off-period between pulses measured at the 7 milliamp level of less than 1 second, or (iii) an on-period measured at the 300 milliamp level of more than 1.5 milliseconds. In order to make the output of the circuit 10 unsafe, one or more of the above parameters can be met by appropriately configuring the circuit (e.g., one or more of changing the input voltage to the circuit 10, using different values for the electrical components of the voltage multiplier 32, altering the rate of the clock in the controller (U1) 50, etc.). Further, with significant deviation from one or more of these parameters (given proper configuring of the circuit 10), the output of the energizer can be made to be lethal. Such modifications should be within the scope of knowledge of one skilled in the art, and as such, will not be further described.

As described above, in certain embodiments, the fence energizer of FIG. 1A can be further configured to either provide an unsafe output, and more preferably, lethal output or alternatively, a safe output (as defined by the UL 69 safety standard). In turn, the fence energizer would be equipped to function in any one of a plurality of modes, depending on the application. For example, in prison applications, during normal periods of time, the fence energizer can be set to a "safe mode", in which a safe electric shock is output from the energizer when the energized fence is contacted. Conversely, during "high alert" periods of time, requiring higher levels of security, the fence energizer can be set to a "lethal mode", in which a lethal electric shock is output from the energizer when the energized fence is contacted. As such, both the "stun mode" and "lethal mode" can be provided using a single fence energizer. This differs from known systems, which generally require separate energizers for providing these two distinct outputs to the energized fence.

Figure 1B:
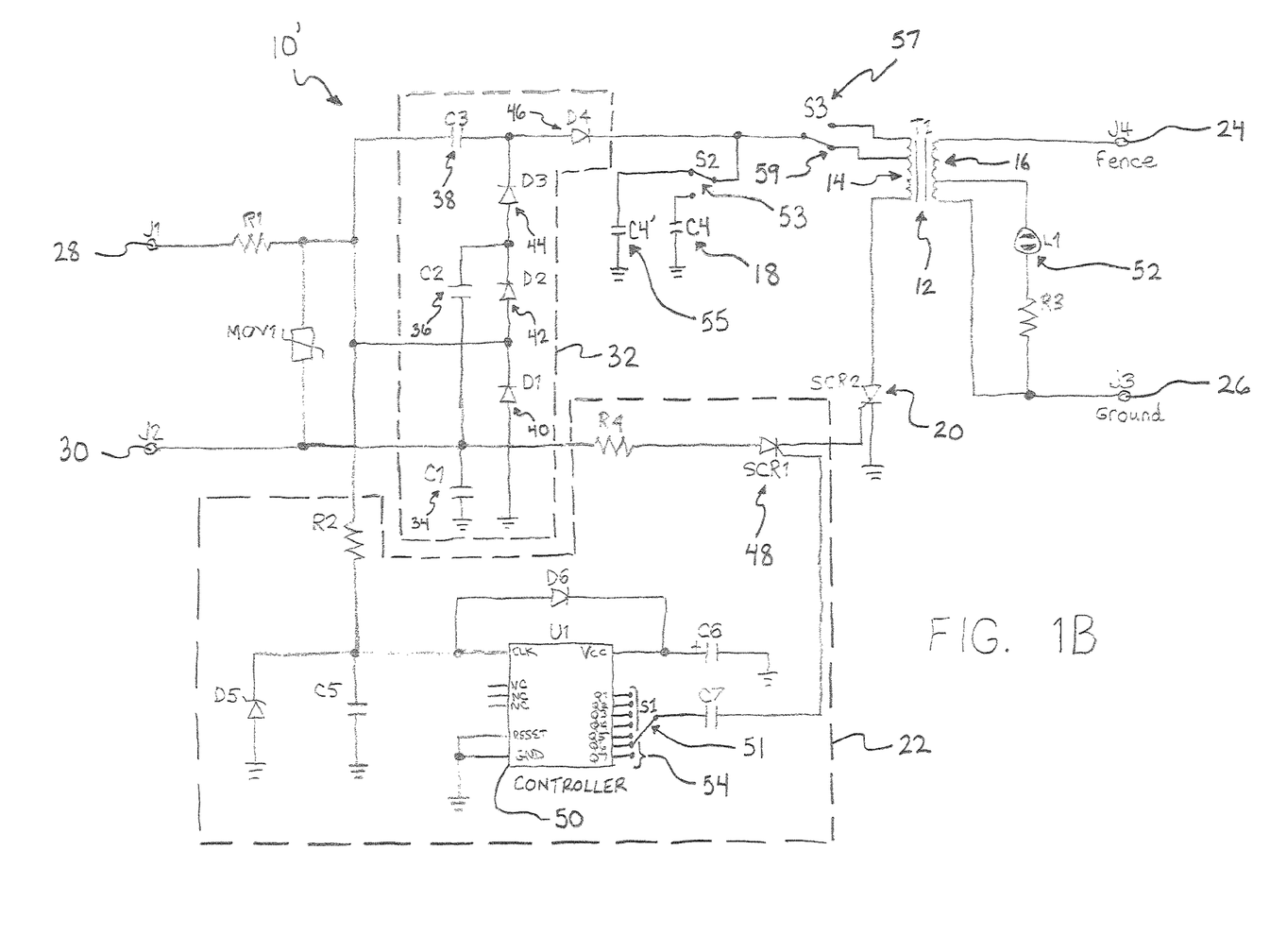
FIG. 1B is a partial circuit schematic for an electric fence energizer relating back to the partial circuit of FIG. 1A which can be operated in one of a plurality of different modes in accordance with certain embodiments of the invention.

As described above, the controller 50 (U1) of the timing circuit 22 can be configured to deliver one or more pulses per second. As shown in FIG. 1A, the controller (U1) 50 has a plurality of outputs 54, each representing a distinct output from the counter within the controller (U1) 50. The plurality of outputs 54 is exemplarily shown having a quantity of seven outputs (Q1-Q7); however, the invention should not be limited to such. As described above, when attempting to provide unsafe output from the circuit 10, one of the outputs 54 of the counter can be correspondingly selected so as to output at least two or more pulses per second. In turn, one would achieve an off-period of less than one second. Likewise, when attempting to provide lethal output from the circuit 10, another of the outputs 54 of the counter can be correspondingly selected so as to output the warranted number of pulses per second (e.g., the number of pulses being eight pulses per second; however, the invention should not be limited to such). Alternatively, when attempting to provide a safe output from the circuit 10, one of the outputs 54 of the counter can be correspondingly selected so as to output a single pulse per second. In turn, provided the output from the circuit 10 is safe (meeting the other UL 69 safety standards regarding current value and on-period duration), the lethal energizer of FIG. 1A can be used as a safe energizer. FIG. 1B illustrates a partial circuit schematic of an electric fence energizer relating back to the partial circuit 10 of FIG. 1A which is configured for such above-described functioning in one of a plurality of different modes in accordance with certain embodiments of the invention.

As shown in FIG. 1B, in certain embodiments, the circuit 10' includes an additional switch (S1) 51 used to facilitate switching between the controller outputs 54. For example, the additional switch (S1) 51 could be provided as a multiplexor (MUX); however, the invention should not be limited to such. Use of the additional switch (S1) 51 provides the energizer circuit 10' the ability to function under at least two different modes, e.g., under a "lethal mode" or a "safe mode", without the need for separate fence energizers and a complex high voltage switch mechanism needed to switch the fence between different energizers.

As should be appreciated, the energizer circuit 10' may need alternate or further modification to switch from a "lethal mode" to a "safe mode" or vice versa. As described above, to provide an output of the circuit 10 of FIG. 1A to be unsafe, one or more of the UL 69 safety parameters are not met. In addition, to provide an output of the circuit of FIG. 1A to be lethal, significant deviation is provided from one or more of the UL 69 safety parameters. As such, depending on which of the UL 69 safety parameters are not met (in achieving an unsafe or lethal output from the energizer), one would need to correspondingly modify one or more portions of the circuit 10 to meet the UL 69 safety parameters in order to achieve a safe output.

As described above, the circuit 10 of FIG. 1A can be used in providing off-periods less than one second to achieve an unsafe or lethal output. In turn, as described above and illustrated in FIG. 1B, the circuit 10' would need to be equipped to include the additional switch (S1) 51 to provide a safe output to the fence. Alternatively or in combination to having the energizer being operated at a pulse rate with an off-period of at least one second, one or more separate switches may be necessitated to switch the circuit 10' for the different modes.

For example, in certain embodiments, as shown, a switch (S2) 53 can be used in switching to a different capacitor (C4') 55 in order to achieve a safe current pulse as well as a safe on-period for the pulse. As should be appreciated, one or more capacitors of the voltage multiplier 32 may also be likewise switched to achieve a safe current pulse as well as a safe on-period for the pulse. Also, in a similar manner, in certain embodiments, a switch (S3) 57 can be used in switching between different taps of the primary winding 14 of the step-up transformer (T1) 12 to change the output of the energizer between the different modes. In turn, a different tap 59 of the primary winding 14 of step-up transformer (T1) 12 can be used to achieve a safe current pulse as well as a safe on-period for the pulses. As should be appreciated, a different step-up transformer having different primary or secondary windings (not shown) can be switched with the step-up transformer (T1) 12 to achieve this same purpose.

In light of the above description with respect to FIG. 1B, it is to be appreciated that the embodiments of the circuit 10' can be implemented in using one or more of the switches 51 (S1), 53 (S2), and 57 (S3). While in certain embodiments, the circuit 10' of FIG. 1B, as shown, can involve the inclusion of each of the switches 51 (S1), 53 (S2), and 57 (S3) as well as the electronics described above working with the switches, the invention should not be limited to such. Instead, one or more of the switches 51 (S1), 53 (S2), and 57 (S3) may be used as shown and still fall within the spirit of the invention.

Figure 2A:
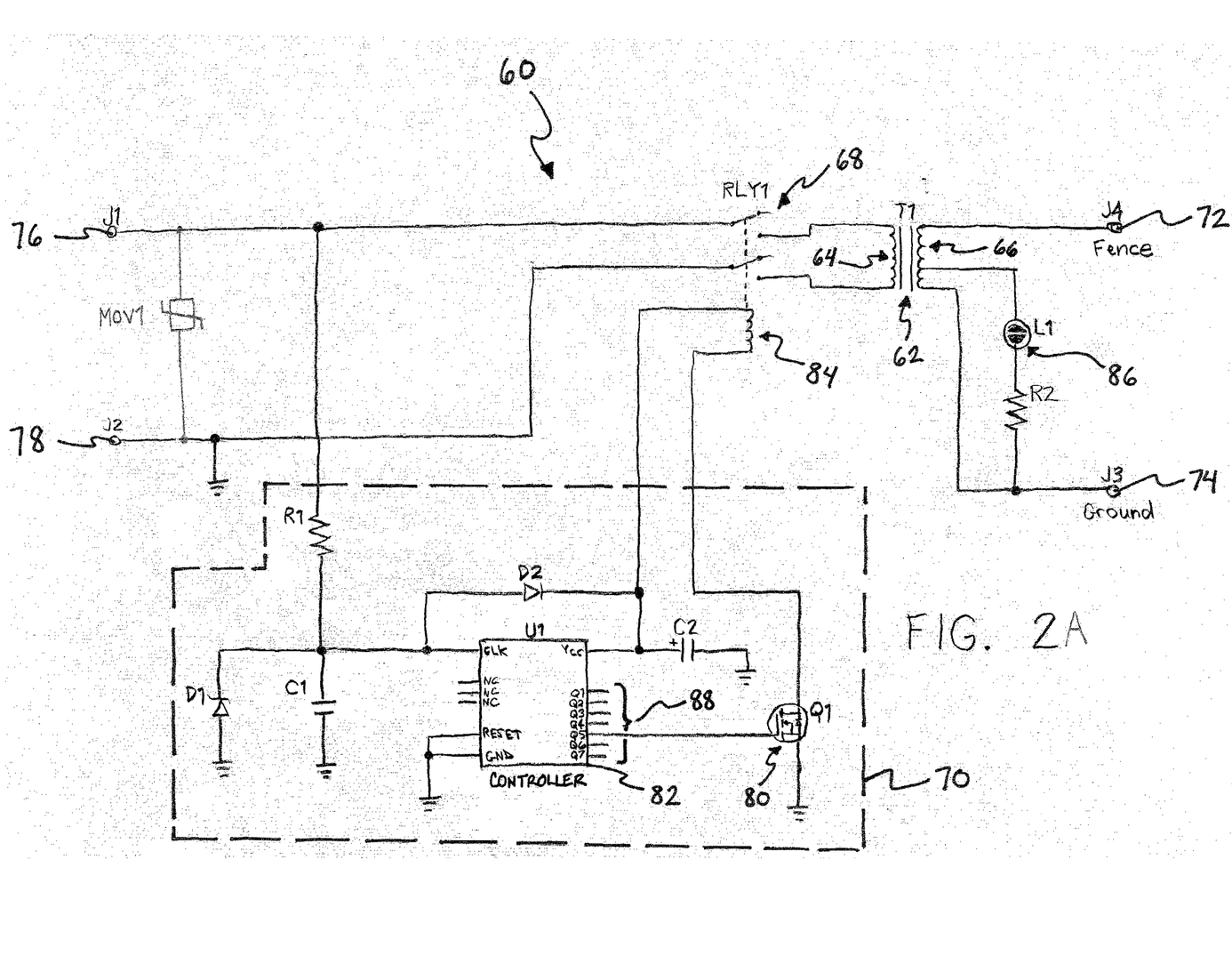
FIG. 2A is another partial circuit schematic for a lethal electric fence energizer in accordance with certain embodiments of the invention.

It has been found that other alternative circuit designs of lethal fence energizers can be used in order to overcome the above-described limitations of existing lethal fence energizers. In certain embodiments, the lethal electric fence energizer is provided with pulsed AC sinusoidal circuitry. As described below, energy from a power source is periodically connected to a linear step-up transformer (i.e., providing specific on-periods and off-periods for the transformer) and the output of the transformer is connected to output terminals for connection to the lethal fence wire. As should be appreciated, the lethal energizer using a linear step-up transformer draws very little current during the off-period and requires high current from the power source during the on-period. In certain embodiments, the duty cycle (i.e., the on-period duration relative to total cycle duration of both the on-period and off-period) of the product is set low enough to keep the average current low to keep the circuit from over-heating. While the linear step-up transformer would require increased current from the supply means with increased fence load (i.e., lower resistance between the lethal energizer's output terminals), the low duty cycle would keep the lethal energizer from over-heating regardless of the fence wire or load that may contact the lethal fence. FIG. 2A illustrates a partial circuit schematic of a lethal electric fence energizer configured for such functioning in accordance with certain embodiments of the invention.

As shown, the circuit 60 of FIG. 2A includes a linear step-up transformer (T1) 62 having a primary winding 64 and a secondary winding 66; a switch (RLY1) 68 (exemplarily represented as a relay; however, the invention should not be limited to such) which is positioned between the power source (not shown) and the primary winding 14, where the switch (RLY1) 68, when opened, facilitates the off-period for the transformer (T1) 62, and when closed, facilitates the on-period for the transformer (T1) 62; a timing circuit 70 for controlling the rate that the switch (RLY1) 68 opens and closes; and a fence terminal (J4) 72 and a ground terminal (J3) 74 each respectively connected to ends of the secondary winding 66 for the purpose of connecting the circuit 60 to a fence wire (not shown).

Similar to that already described above with respect to FIG. 1A, in use, a voltage stemming from the power source is provided across inputs (J1) 76 and (J2) 78 of the circuit 60. The input voltage can generally range from 105 volts to 125 volts AC, 50-60 Hz. In turn, the input voltage is delivered across the switch (RLY1) 68. As shown and described above, the switch (RLY1) 68 is positioned between the power source and the primary winding 64 of the linear step-up transformer (T1) 62. As should be appreciated, the switch (RLY1) 68 can be any applicable switch, and is only exemplarily provided herein as relay switch RLY1. The opening and closing of the switch (RLY1) 68 functions in respectively delivering the input voltage to the primary winding 64 of the transformer (T1) 62. The opening and closing of the switch (RLY1) 68 is provided by the timing circuit 70, and in certain embodiments, is provided via a further switch (Q1) 80 (exemplarily provided as a transistor; however the invention should not be limited to such) connected to an output of the timing circuit 70.

Similar to the circuit 10 of FIG. 1A, in certain embodiments, the timing circuit 70 of the circuit 60 of FIG. 2A includes a controller (U1) 82. As should be appreciated, the input voltage to the circuit 60 can be converted to DC so as to power the controller (U1) 82. In use, the controller (U1) 82 serves as a counter, which is used to establish a triggering rate for the opening and closing of the switch (RLY1) 68. As should be appreciated, the controller (U1) 82 is configured to deliver one or more pulses per second, with every pulse facilitating a closing of the switch (RLY1) 68 and a subsequent delivery of the input voltage to the primary winding 64 of the transformer (T1) 62. In certain embodiments, as shown, the further switch (Q1) 80 is electrically connected between the output of the timing circuit 70 and a back end of a winding 84. In turn, every pulse delivered from the controller (U1) 82 facilitates a closing of the switch (Q1) 80, which in turn, induces a closing of the switch (RLY1) 68 via the winding 84. In certain embodiments, the timing circuit 70 can be thermally controlled by the temperature change of one or more electrical components (e.g., the controller (U1) 82) within the circuit 60.

As described above, every time the switch (RLY1) 68 is closed, the input voltage of the circuit 60 is delivered to the primary winding 64 of the linear step-up transformer (T1) 62. In turn, this voltage is transformed across the secondary winding 66 of the transformer (T1) 62 to a voltage of several thousand volts AC. The transformed voltage is subsequently delivered across the fence terminal (J4) 72 and the ground terminal (J3) 74. In certain embodiments, as shown, a light (L1) 86 (e.g., a neon light) is connected to the secondary winding 66 as well. In turn, every time voltage is delivered to the primary winding 64 (via the switch (RLY1) 68 closing) and subsequently transformed across the secondary winding 66, the light (L1) 86 will be triggered to show the circuit's operation.

As should be appreciated, because the lethal energizer circuit 60 of FIG. 2A provides on- and off-periods for the linear step-up transformer (T1) 62 (via the switch (RLY1) 68 and timing circuit 70), the transformer (T1) 62 applies lethal power to the fencing system, but only periodically. Further, in an effort to keep the transformer (T1) 62 from overheating during the on-periods, the duty cycle is kept low. In turn, the lethal energizer only applies power to the fence for short periods of time. As such, even if a small load tends to over-drive the lethal energizer, the effect on the energizer is limited because it is only delivering power to the fence over these short periods of time. This intermittent application of power from the lethal energizer to the fence has been found to generally insulate the energizer from damage regardless of the load applied to the fence. As a result, the energizer has been found to not fail catastrophically like existing lethal fence energizers.

Similar to that already described above with respect to the circuit 10 of FIG. 1A, the output of the circuit 60 of FIG. 2A, and in turn, the corresponding lethal fence energizer can be considered unsafe if, when connected to a resistive load of at least 500 ohms, the energizer has (i) an output current pulse or pulse segment more than I, where $I=20 \times T^{-0.7}$, where T equals pulse width in milliseconds, or (ii) an off-period between pulses measured at the 7 milliamp level of less than 1 second, or (iii) an on-period measured at the 300 milliamp level of more than 1.5 milliseconds. In order to make the output of the circuit 10 unsafe, one or more of the above parameters can be met by appropriately configuring the circuit (e.g., one or more of changing the input voltage to the circuit 60, altering the rate of the clock in the controller 82 (U1), etc.). Further, with significant deviation from these parameters (given proper configuring of the circuit 60), the output of the energizer can be made to be lethal. Such modifications should be within the scope of knowledge of one skilled in the art, and as such, will not be further described.

Figure 2B:
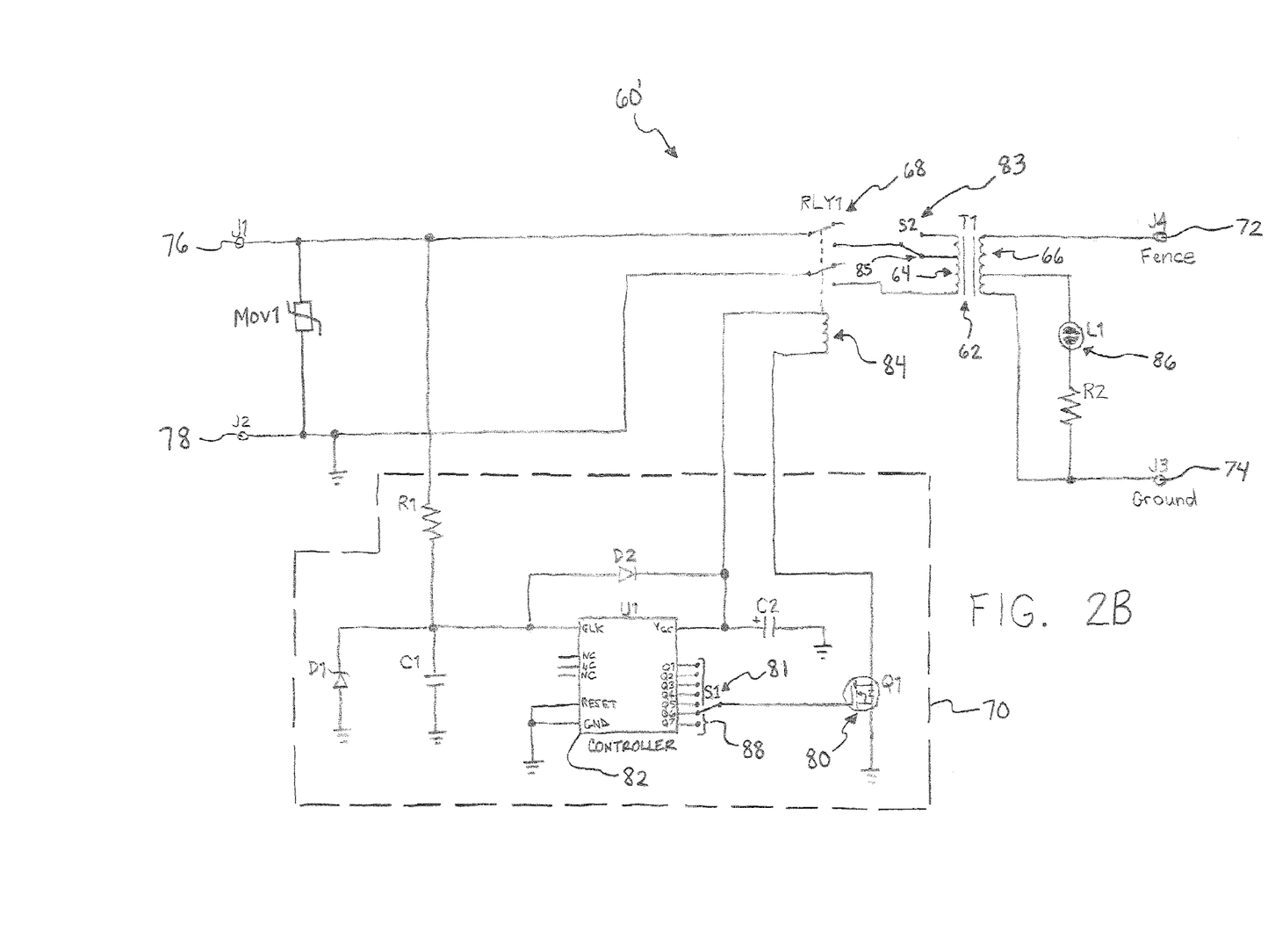
FIG. 2B is a partial circuit schematic for an electric fence energizer relating back to the partial circuit of FIG. 2A which can be operated in one of a plurality of different modes in accordance with certain embodiments of the invention.

In a similar manner already described above with respect to FIG. 1B, the energizer shown in FIG. 2B, in certain embodiments, can be modified with a switch 81 (S1) to facilitate switching between outputs 88 of the controller (U1) 82. As such, the energizer circuit 60' of FIG. 2B can be modified to alter the pulse rate from an "unsafe mode" or "lethal mode" (less than 1 second off-period) to a "safe mode" (at least 1 second off-period) or vice versa, if warranted. Further, in a similar manner mentioned above with respect to FIG. 1B, a switch 83 (S2) can be used in switching between different taps of the primary winding 64 of the step-up transformer (T1) 62 to change the output of the energizer between the different modes. In turn, a different tap 85 of the primary winding 64 of step-up transformer (T1) 62 can be used to achieve a safe current pulse as well as a safe on-period for the pulses. As should be appreciated, a different step-up transformer having different primary or secondary windings (not shown) can be switched with the step-up transformer (T1) 62 to achieve this same purpose.

In light of the above description with respect to FIG. 2B, it is to be appreciated that the embodiments of the circuit 60' can be implemented in using one or more of the switches 81 (S1) and 83 (S2). While in certain embodiments, the circuit 60' of FIG. 2B, as shown, can involve the inclusion of each of the switches 81 (S1) and 83 (S2) as well as the electronics described above working with the switches, the invention should not be limited to such. Instead, one or more of the switches 81 (S1) and 83 (S2) may be used as shown and still fall within the spirit of the invention.

Figure 3A:
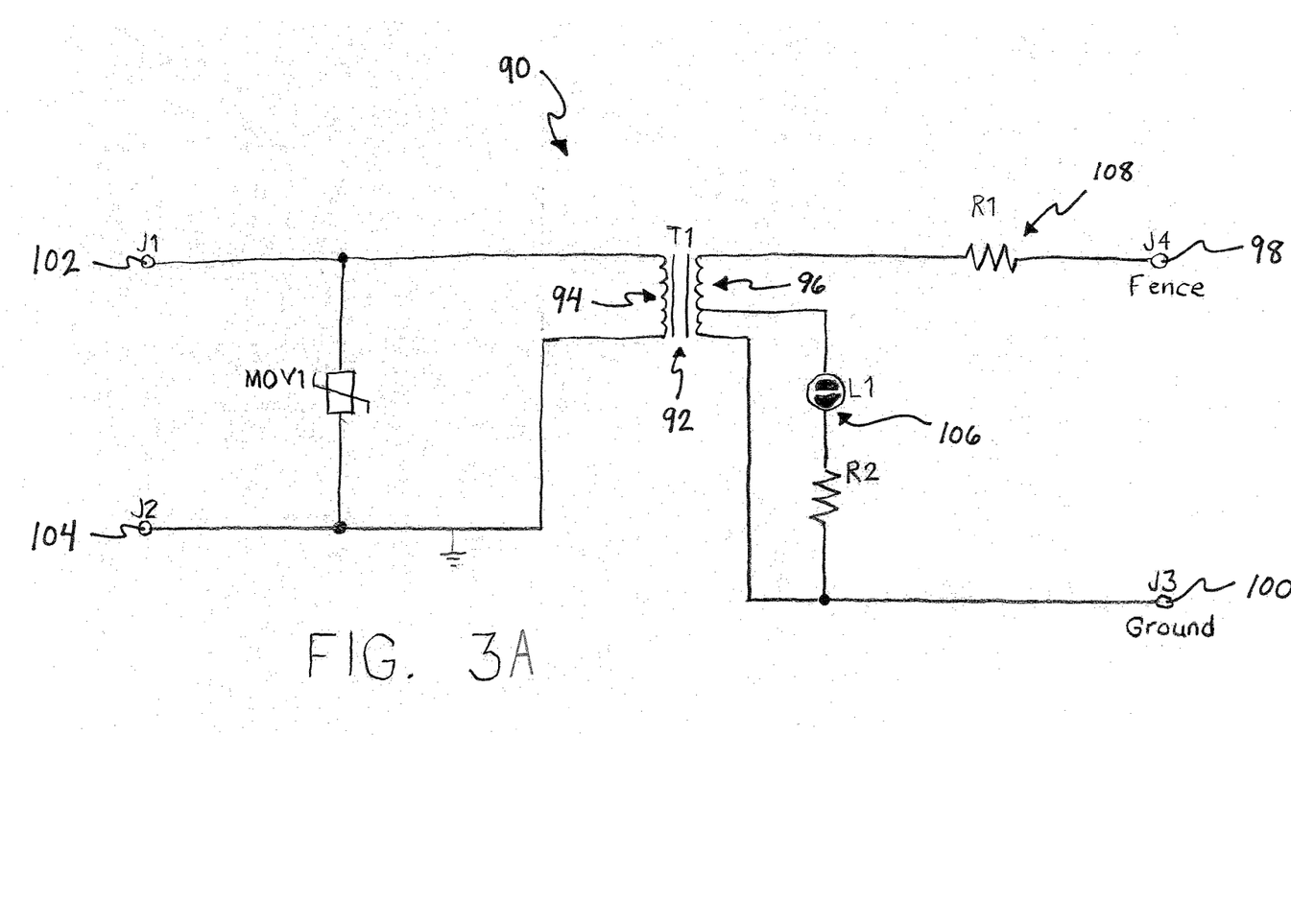
FIG. 3A is a further partial circuit schematic for a lethal electric fence energizer in accordance with certain embodiments of the invention.
Figure 4A:
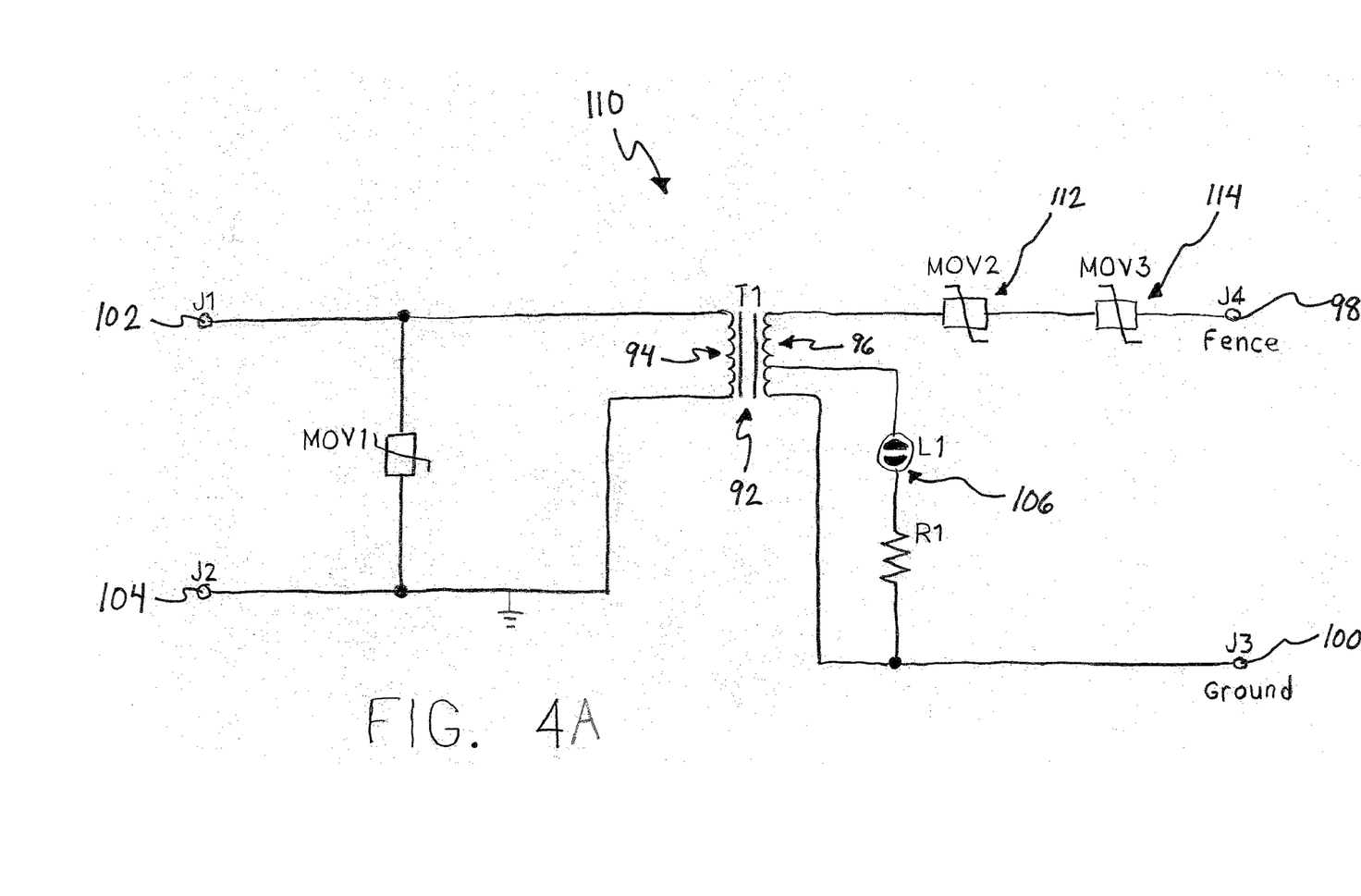
FIG. 4A is an alternative partial circuit schematic for a lethal electric fence energizer to that provided in FIG. 3A in accordance with certain embodiments of the invention.

It has been found that further alternative circuit designs of lethal fence energizers can be used in order to overcome the above-described limitations of existing lethal fence energizers. In certain embodiments, the lethal electric fence energizer is provided with continuous AC sinusoidal circuitry. As described below, energy from a power source is connected to a linear step-up transformer and the output of the transformer is connected to output terminals for connection to the lethal fence wire. While the circuitry of this embodiment is such that increased fence load (i.e., lower resistance between the lethal energizer's output terminals) causes increased current from the supply means, different methods to keep the transformer from over-heating can be utilized. Some of these methods can involve placing one or more current limiting or voltage dependent devices in series with a fence output terminal of the step-up transformer in order to limit the current delivered to the load regardless of the load seen by the transformer, as illustrated in FIGS. 3A and 4A, respectively. Another method, illustrated in FIG. 5A, can involve using a current limiting transformer to limit the load seen by the transformer. These methods would allow the lethal energizer to operate continuously regardless of the fence wire or load that may be connected to the lethal energizer's output terminals. As mentioned above, FIGS. 3A, 4A, and 5A illustrate partial circuit schematics of a lethal electric fence energizer configured for the above-described functioning in accordance with certain embodiments of the invention.

Figure 5A:
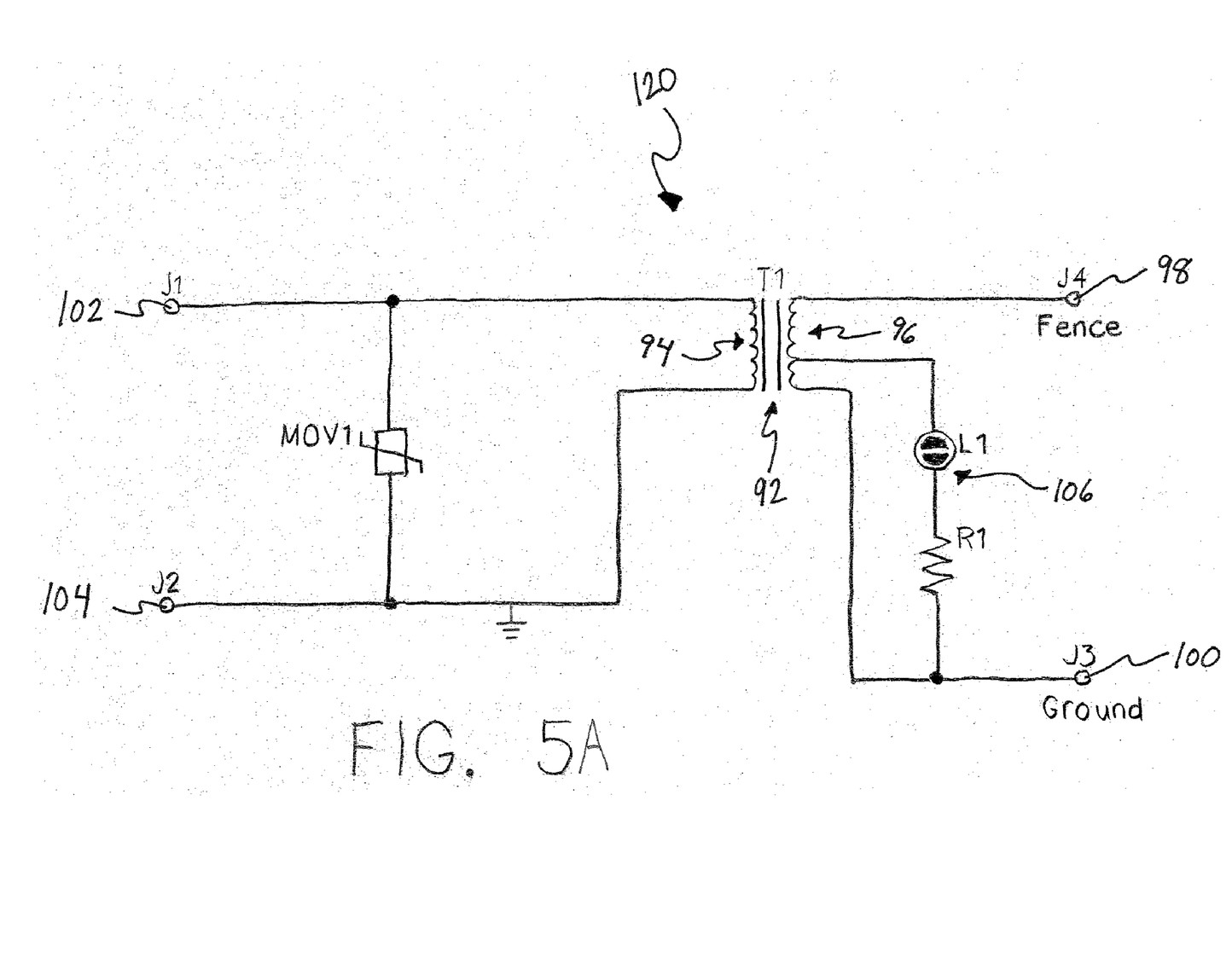
FIG. 5A is an additional circuit schematic for a lethal electric fence energizer in accordance with certain embodiments of the invention.

As shown, the circuit 90 of FIG. 3A, the circuit 110 of FIG. 4A, and the circuit 120 of FIG. 5A each include a step-up transformer (T1) 92 having a primary winding 94 and a secondary winding 96; a fence terminal (J4) 98 and a ground terminal (J3) 100 each respectively connected to ends of the secondary winding 96 for the purpose of connecting the circuit 90 or 110 to a fence wire (not shown); and a current limiting means to prevent the transformer (T1) 92 from overheating.

Similar to that already described above with respect to FIGS. 1A and 2A, in use, a voltage stemming from the power source is provided across inputs (J1) 102 and (J2) 104 of the circuits 90, 110, and 120. The input voltage can generally range from 105 volts to 125 volts AC, 50-60 Hz. In turn, the input voltage is delivered to the primary winding 94 of the transformer (T1) 92 and transformed across the secondary winding 96 of the transformer (T1) 92 to a voltage of several thousand volts AC. The transformed voltage is subsequently delivered across the fence terminal (J4) 98 and the ground terminal (J3) 100. In certain embodiments, as shown, a light (L1) 106 (e.g., a neon light) is connected to the secondary winding 96 as well. In turn, as the voltage is delivered to the primary winding 94 and subsequently transformed across the secondary winding 96, the light (L1) 106 will be triggered to show the circuit's operation.

As described above, a current limiting means is provided within the circuits 90, 110, and 120 to prevent the step-up transformer (T1) 92 from overheating in the event one or more bodies having low resistance contact the fence wire. In certain embodiments, as shown in FIG. 3A, the current limiting means is a high power resistor (R1) 108. The value of the resistor (R1) 108 is greater or equal to $P/I^2$, where P is the rated output power of the step-up transformer (T1) 92 and I is the output current at the rated power of the transformer (T1) 92. In certain embodiments, as shown in FIG. 4A, the current limiting means is one or more metal oxide varistors (MOV); however, the invention should not be limited to such as other similar voltage dependent devices would also suffice. While a quantity of two MOVs are shown in FIG. 4A (referenced as varistors (MOV2) 112 and (MOV3) 114, this is exemplarily shown, and the invention should not be limited to any particular quantity. The values of the varistors (MOV2) 112 and (MOV3) 114 are each greater or equal to P/I, where P is the rated output power of the step-up transformer (T1) 92 and I is the output current at the rated power of the transformer (T1) 92. In certain embodiments, as shown in FIG. 5A, the current limiting means is the step-up transformer (T1) 92, where the transformer (T1) has a current limiting design.

As described above, the respective lethal energizer circuits 90, 110, and 120 of FIGS. 3A, 4A, and 5A function in limiting the amount of current driven from the transformer (T1) 92. In turn, the transformer (T1) 92 is kept from overheating during operation regardless of load on the fence wire. As a result, the energizer has been found to not fail catastrophically like existing lethal fence energizers. Because the output from the transformer (T1) 92 of the circuits 90, 110, and 120 is continuous, the corresponding fence energizers can be considered lethal if, when connected to a resistive load of at least 500 ohms, the energizer has an on-period measured at the 300 milliamp level of more than 1.5 milliseconds or if the energizer delivers significantly more than 7 milliamps. In order to make the output of the circuit 10 unsafe, one or more of the above parameters can be met by appropriately configuring the circuits 90, 110, 120 (e.g., changing the input voltage to the circuits). Further, with significant deviation from these parameters (given proper configuring of the circuits 90, 110, 120), the output of the energizer can be made to be lethal. Such modifications should be within the scope of knowledge of one skilled in the art, and as such, will not be further described.

As should be appreciated, in certain embodiments, to utilize the current limiting means described in FIG. 3A, FIG. 4A, or FIG. 5A, and provide corresponding energizers with the capability of operating in either a "safe mode" or "unsafe mode", or more preferably, "lethal mode", a timing circuit 70' and switch (RLY1) 68' can be provided (similar to timing circuit 70 and switch (RLY1) 68 of FIG. 2A) between the power source inputs (J1) 102 and (J2) 104 and the step-up transformer (T1) 92 to provide on-period and off-periods for the pulses to the transformer (T1) 92. As described for the energizer circuit 10 of FIG. 1B and the energizer circuit 60 of FIG. 2B, a switch (S1) 101 can be provided between outputs 88' of a controller (U1) 82' of the timing circuit 70' and the switch (RLY1) 68' to change the pulse rate from an "unsafe mode" or "lethal mode" (less than 1 second off-period) to a "safe mode" (at least 1 second off-period) or vice versa. In turn, in a similar manner described above with respect to FIG. 2A, the energizers shown in FIG. 3A, FIG. 4A, and FIG. 5A can include a switch (S2) 103 used to switch between different taps of the primary winding 94 of the step-up transformer (T1) 92 to change the output of the energizer between the different modes. In turn, a different tap 105 of the primary winding 94 of step-up transformer (T1) 92 can be used to achieve a safe current pulse as well as a safe on-period for the pulses. As should be appreciated, a different step-up transformer having different primary or secondary windings (not shown) can be switched with the step-up transformer (T1) 92 to achieve this same purpose.

Figure 3B:
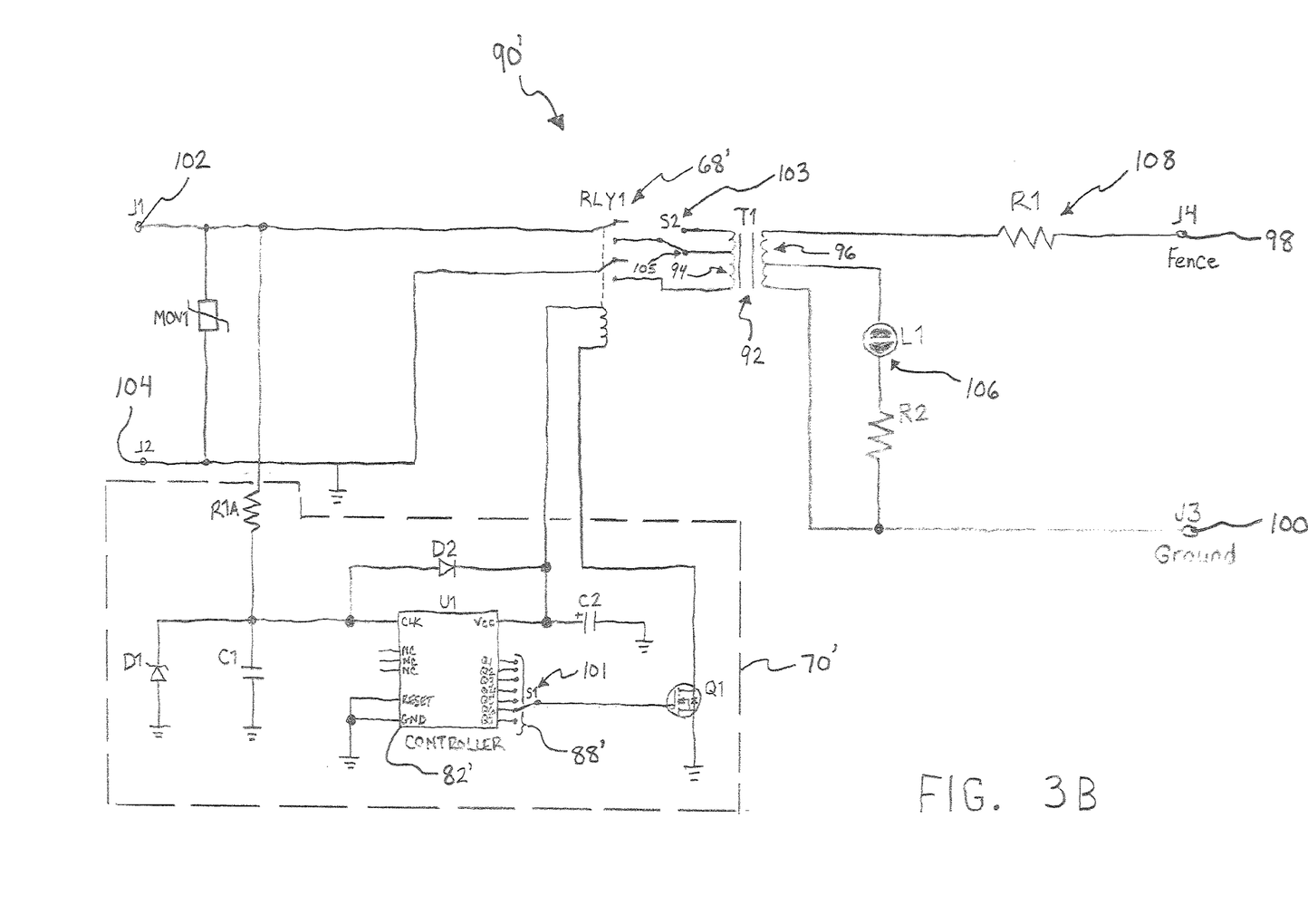
FIG. 3B is a partial circuit schematic for an electric fence energizer relating back to the partial circuit of FIG. 3A which can be operated in one of a plurality of different modes in accordance with certain embodiments of the invention.
Figure 4B:
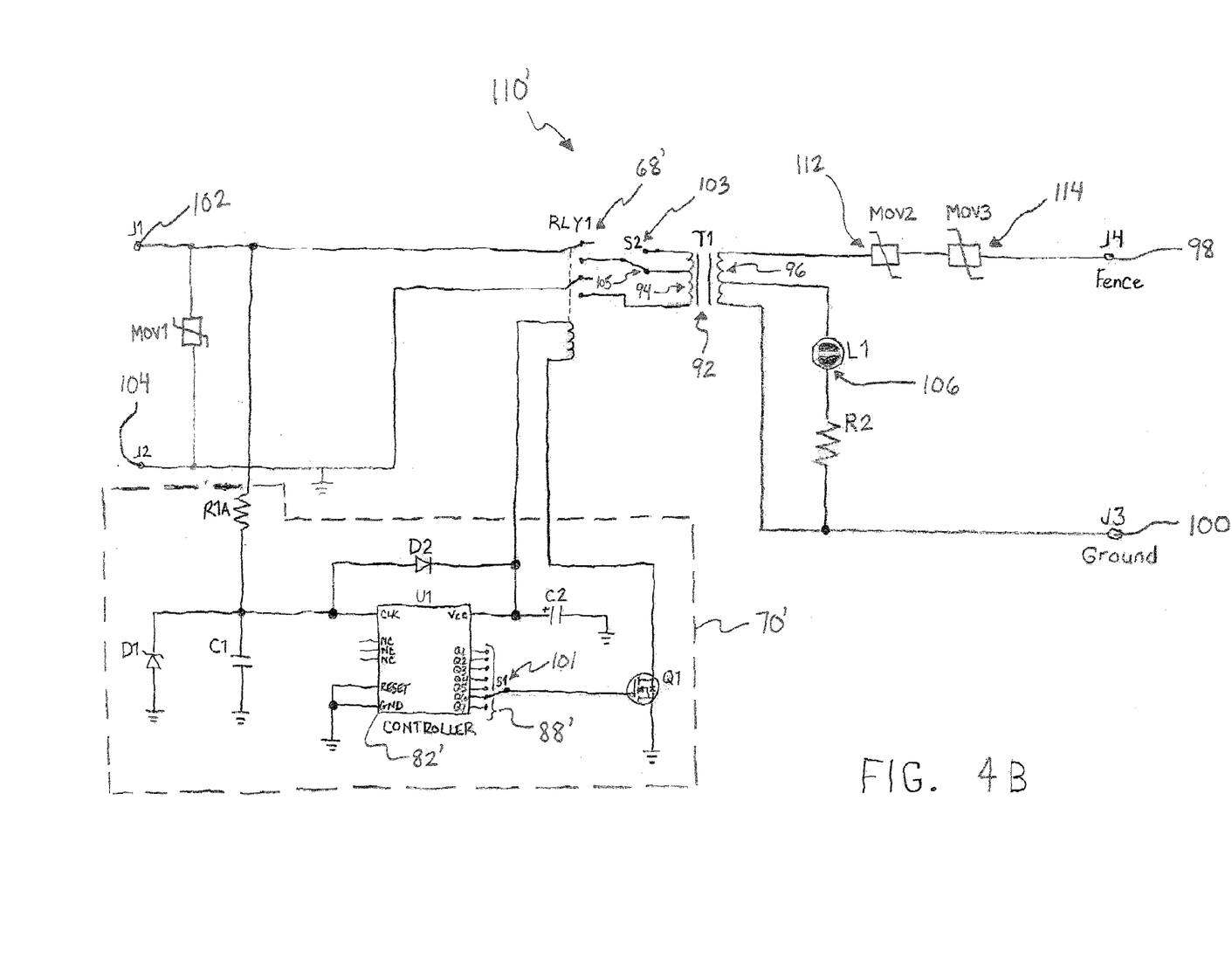
FIG. 4B is a partial circuit schematic for an electric fence energizer relating back to the partial circuit of FIG. 4A which can be operated in one of a plurality of different modes in accordance with certain embodiments of the invention.
Figure 5B:
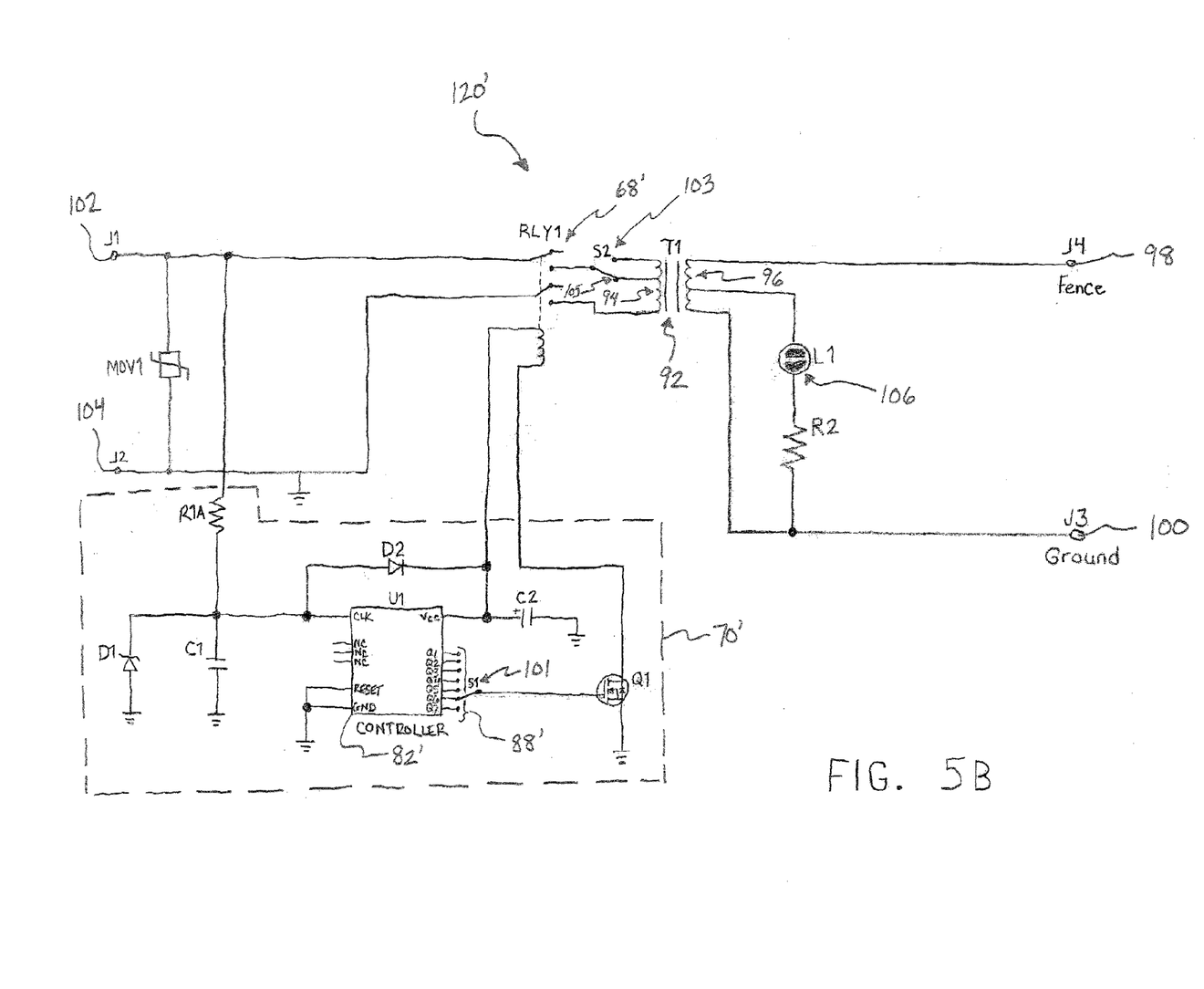
FIG. 5B is a partial circuit schematic for an electric fence energizer relating back to the partial circuit of FIG. 5A which can be operated in one of a plurality of different modes in accordance with certain embodiments of the invention.

In light of the above description with respect to FIGS. 3B, 4B, and 5B, it is to be appreciated that the embodiments of the respective circuits 90', 110', and 120' can be implemented in using one or more of the switches (S1) 101 and (S2) 103. While in certain embodiments, the circuit circuits 90', 110', and 120' of FIGS. 3B, 4B, and 5B, as shown, can involve the inclusion of each of the switches (S1) 101 and (S2) 103 as well as the electronics described above working with the switches, the invention should not be limited to such. Instead, one or more of the switches (S1) 101 and (S2) 103 may be used as shown and still fall within the spirit of the invention.

As should be appreciated, the step-up transformers in each of the circuits illustrated and described above (step-up transformer (T1) 12 in circuits 10 and 10' of FIGS. 1A and 2A, step-up transformer (T1) 62 in circuits 60 and 60' of FIGS. 2A and 2B, and step-up transformer (T1) 92 in circuits 90 and 90' of FIGS. 3A and 3B, circuits 110 and 110' of FIGS. 4A and 4B, and circuits 120 and 120' of FIGS. 5A and 5B) may be provided with an output impedance less than 1000 Ohms such that the corresponding lethal energizers can maintain adequately high voltage on the lethal fence wire when a 1000 Ohm load (or human) contacts the fence. In addition, such step-up transformers may also be provided with an output impedance significantly less than 1000 Ohms such that the corresponding lethal energizers could maintain high voltage on the lethal fence wire when the fence wire is in contact with multiple 1000 Ohm loads (or humans).

As should be appreciated, to provide the lethal energizers with a transformer having an output impedance of less than 1000 ohms, changes to reduce the transformer's output impedance may include increased primary wire diameter, increased secondary wire diameter, decreased primary turns, decreased secondary turns, along with increased size of core material used for the transformer. While the step-up transformers used in FIGS. 1A-5B all differ significantly from each other in design (e.g., wire size, wire diameter, and core construction), one skilled in the art would appreciated that the above-described changes would universally apply to each for providing a transformer with a reduced output impedance of less than 1000 Ohms.

It will be appreciated the embodiments of the present invention can take many forms. The true essence and spirit of these embodiments of the invention are defined in the appended claims, and it is not intended the embodiment of the invention presented herein should limit the scope thereof.

What is claimed is:

1. An electric fence energizer for use with an alternating current power source for continuously applying electrical energy pulses including at least lethal pulses to a fence without failing due to resistive loads contacting the fence comprising:
   a step-up transformer having a primary winding and a secondary winding, the secondary winding being adapted for connection to the fence;
   a storage capacitor sharing a connection with both the primary winding of the transformer and an input being adapted for connection to the power source;
   a switch connected to the primary winding of the transformer, the switch being operative to supply voltage stored in the storage capacitor across the primary winding when the switch is closed; and
   a timing circuit adapted to periodically trigger the switch so as to provide alternating on-periods and off-periods for the lethal pulses being delivered from the step-up transformer to the fence.

2. The energizer of claim 1 wherein the lethal pulses or pulse segments delivered to a load not less than 500 ohms have one or more of (i) a current in milliamps rms being greater than $20T^{-0.7}$ where T equals pulse width in milliseconds, (ii) off-periods between the pulses measured at 7 milliamp level being less than 1 second, and (iii) on-periods measured at 300 milliamp level being greater than 1.5 milliseconds.

3. The energizer of claim 1 further comprising a voltage multiplier connected between the storage capacitor and the input.

4. The energizer of claim 1 wherein the timing circuit includes a controller having an internal counter, wherein the counter is programmed to periodically trigger the switch.

5. The energizer of claim 1 where the output impedance of the step-up transformer is less than 1000 Ohms.

6. The energizer of claim 5 wherein the step-up transformer has one or more of increased wire diameter of the primary winding, increased wire diameter of the secondary winding, decreased turns for the primary winding, decreased turns for the wire diameter, and increased size of core material as opposed to other standard step-up transformers.

7. The energizer of claim 1 further comprising one or more secondary switches, where one of the secondary switches is positioned between one or more of the storage capacitor and the primary winding and a controller within the timing circuit and the primary winding so as to vary one or more of the off-periods, the on-periods, and current of the pulses in order for the fence energizer to operate in one of a plurality of modes.

8. The energizer of claim 7, wherein the modes include two or more of a lethal mode, a safe mode, and an unsafe mode.

9. The energizer of claim 7 wherein the one secondary switch when positioned between the controller and the primary winding is selectively switchable between the outputs of the controller, wherein each of the outputs has a designated pulse rate corresponding thereto.

10. The energizer of claim 7 wherein the one secondary switch when positioned between the storage capacitor and the primary winding is selectively switchable between the storage capacitor and a further capacitor.

11. The energizer of claim 7 wherein the one secondary switch when positioned between the storage capacitor and the primary winding is selectively switchable between the storage capacitor and different taps of the primary winding.

12. An electric fence energizer for use with an alternating current power source for continuously applying electrical energy pulses including at least lethal pulses to a fence without failing due to resistive loads contacting the fence comprising:
   a step-up transformer having a primary winding and a secondary winding, the secondary winding being adapted for connection to the fence;
   a switch connected between the primary winding of the transformer and an input being adapted for connection to the power source, the switch being operative to supply voltage from the power source across the primary winding when the switch is closed; and
   a timing circuit adapted to periodically trigger the switch so as to provide alternating on-periods and off-periods for the lethal pulses being delivered from the step-up transformer to the fence.

13. The energizer of claim 12 wherein the lethal pulses or pulse segments delivered to a load not less than 500 ohms have one or more of (i) a current in milliamps rms being greater than $20T^{-0.7}$ where T equals pulse width in milliseconds, (ii) off-periods between the pulses measured at 7 milliamp level being less than 1 second, and (iii) on-periods measured at 300 milliamp level being greater than 1.5 milliseconds.

14. The energizer of claim 12 wherein the step-up transformer is a linear step-up transformer.

15. The energizer of claim 12 wherein the timing circuit includes a controller having an internal counter, wherein the counter is programmed to periodically trigger the switch.

16. The energizer of claim 12 wherein the timing circuit is thermally controlled via a temperature change of one or more electric components of the energizer.

17. The energizer of claim 12 where the output impedance of the step-up transformer is less than 1000 Ohms.

18. The energizer of claim 17 wherein the step-up transformer has one or more of increased wire diameter of the primary winding, increased wire diameter of the secondary winding, decreased turns for the primary winding, decreased turns for the wire diameter, and increased size of core material as opposed to other standard step-up transformers.

19. The energizer of claim 12 further comprising one or more secondary switches, where one of the secondary switches is positioned between one or more of the power source and the primary winding and a controller within the timing circuit and the primary winding so as to vary one or more of the off-periods, the on-periods, and current of the pulses in order for the fence energizer to operate in one of a plurality of modes.

20. The energizer of claim 19, wherein the modes include two or more of a lethal mode, a safe mode, and an unsafe mode.

21. The energizer of claim 19 wherein the one secondary switch when positioned between the controller and the primary winding is selectively switchable between the outputs of the controller, wherein each of the outputs has a designated pulse rate corresponding thereto.

22. The energizer of claim 19 wherein the one secondary switch when positioned between the power source and the primary winding is selectively switchable between the power source and different taps of the primary winding.

23. An electric fence energizer for use with an alternating current power source for continuously applying electrical energy pulses including at least lethal pulses to a fence without failing due to resistive loads contacting the fence comprising:
   a step-up transformer having a primary winding and a secondary winding, the secondary winding being adapted for connection to the fence; and
   a current limiting means to prevent the step-up transformer from overheating when the lethal pulses are delivered to the fence.

24. The energizer of claim 23 wherein the lethal pulses or pulse segments delivered to a load not less than 500 ohms have one or more of (i) a current in milliamps rms being greater than $20T^{-0.7}$ where T equals pulse width in milliseconds, (ii) off-periods between the pulses measured at 7 milliamp level being less than 1 second, and (iii) on-periods measured at 300 milliamp level being greater than 1.5 milliseconds.

25. The energizer of claim 23 wherein the current limiting means is a high power resistor having a resistance value greater or equal to $P/I^2$, where P is rated output power of the step-up transformer and I is output current at the rated output power of the transformer.

26. The energizer of claim 23 wherein the current limiting means is a voltage dependent device having a voltage value greater or equal to P/I, where P is rated output power of the step-up transformer and I is output current at the rated output power of the transformer.

27. The energizer of claim 26 wherein the voltage dependent device comprises a metal oxide varistor.

28. The energizer of claim 23 wherein the current limiting means is the step-up transformer, where the transformer has a current limiting design.

29. The energizer of claim 23 where the output impedance of the step-up transformer is less than 1000 Ohms.

30. The energizer of claim 29 wherein the step-up transformer has one or more of increased wire diameter of the primary winding, increased wire diameter of the secondary winding, decreased turns for the primary winding, decreased turns for the wire diameter, and increased size of core material as opposed to other standard step-up transformers.

31. The energizer of claim 23 further comprising one or more secondary switches, where one of the secondary switches is positioned between one or more of the power source and the primary winding and a controller within the timing circuit and the primary winding so as to vary one or more of the off-periods, the on-periods, and current of the pulses in order for the fence energizer to operate in one of a plurality of modes.

32. The energizer of claim 31, wherein the modes include two or more of a lethal mode, a safe mode, and an unsafe mode.

33. The energizer of claim 31 wherein the one secondary switch when positioned between the controller and the primary winding is selectively switchable between the outputs of the controller, wherein each of the outputs has a designated pulse rate corresponding thereto.

34. The energizer of claim 31 wherein the one secondary switch when positioned between the power source and the primary winding is selectively switchable between the power source and different taps of the primary winding.

35. An electric fence energizer for use with an alternating current power source which is switchable between operating modes and, when used for applying lethal electrical energy pulses to a fence, is adapted to continuously operate without failing due to resistive loads contacting the fence comprising:
- a step-up transformer having a primary winding and a secondary winding, the secondary winding being adapted for connection to the fence;
- a switch connected to the primary winding of the transformer, the switch being operative to supply voltage across the primary winding when the switch is closed;
- a timing circuit adapted to periodically trigger the switch so as to provide alternating on-periods and off-periods for the lethal pulses being delivered from the step-up transformer to the fence; and
- one or more secondary switches, where one of the secondary switches is positioned between one or more of the power source and the primary winding and a controller within the timing circuit and the primary winding so as to vary one or more of the off-periods, the on-periods, and current of the pulses in order for the fence energizer to operate in one of a plurality of modes.

36. The energizer of claim 35, wherein the operating modes include two or more of a lethal mode, a safe mode, and an unsafe mode.

37. The energizer of claim 35 further comprising a storage capacitor, where the storage capacitor shares a connection with both the primary winding of the transformer and an input being adapted for connection to the power source, and wherein the one secondary switch when positioned between the power source and the primary winding is positioned between the storage capacitor and the primary winding.

38. The energizer of claim 37 wherein the one secondary switch when positioned between the storage capacitor and the primary winding is selectively switchable between the storage capacitor and a further capacitor.

39. The energizer of claim 37 wherein the one secondary switch when positioned between the storage capacitor and the primary winding is selectively switchable between the storage capacitor and different taps of the primary winding.

40. The energizer of claim 35 wherein the one secondary switch when positioned between the controller and the primary winding is selectively switchable between the outputs of the controller, wherein each of the outputs has a designated pulse rate corresponding thereto.

41. The energizer of claim 35 wherein the one secondary switch when positioned between the power source and the primary winding is selectively switchable between the power source and different taps of the primary winding.

* * * * *